(12) United States Patent
Shintani

(10) Patent No.: US 6,887,738 B2
(45) Date of Patent: May 3, 2005

(54) METHOD OF MAKING SEMICONDUCTOR DEVICE WITH FLIP CHIP MOUNTING

(75) Inventor: Susumu Shintani, Sakurai (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/293,441

(22) Filed: Nov. 14, 2002

(65) Prior Publication Data

US 2003/0067084 A1 Apr. 10, 2003

Related U.S. Application Data

(62) Division of application No. 09/886,035, filed on Jun. 22, 2001, now abandoned.

(30) Foreign Application Priority Data

Jun. 28, 2000 (JP) .......................................... 2000-194780

(51) Int. Cl.[7] .......................... H01L 21/44; H01L 21/48; H01L 21/50; H01L 23/48; H01L 23/52
(52) U.S. Cl. ........................ 438/108; 438/613; 257/772; 257/778
(58) Field of Search ................................ 438/108, 613; 257/772, 778; 228/180.22

(56) References Cited

U.S. PATENT DOCUMENTS

| 6,107,109 A | 8/2000 | Akram et al. |
| 6,137,184 A | 10/2000 | Ikegami |
| 6,212,768 B1 * | 4/2001 | Murakami ..................... 29/840 |
| 6,223,429 B1 | 5/2001 | Kaneda et al. |
| 6,543,668 B1 * | 4/2003 | Fujii et al. ................... 228/103 |

FOREIGN PATENT DOCUMENTS

| JP | 10-189655 | 7/1998 |
| JP | 10-233413 | 9/1998 |
| JP | 11-126795 | 5/1999 |
| JP | 11-204913 | 7/1999 |
| JP | 11-233562 | 8/1999 |
| JP | 11-284022 | 10/1999 |
| JP | 11-345302 | 12/1999 |

OTHER PUBLICATIONS

Japanese Office Action dated Sep. 9, 2003 along with English Translation.

* cited by examiner

*Primary Examiner*—Craig A. Thompson
*Assistant Examiner*—Nema Berezny
(74) *Attorney, Agent, or Firm*—Nixon & Vanderhye P.C.

(57) ABSTRACT

A semiconductor device is arranged such that a semiconductor chip having electrodes is flip chip mounted on printed substrate pads on a printed wiring substrate by a bump formed on each electrode. The semiconductor chip and the printed wiring substrate are fixed with a thermo-setting resin. A penetration hole is formed within an area where the printed substrate pad contacts each gold bump, and the gold bump has a joint section also on a side face of the penetration hole of the printed substrate pad. With this structure, the semiconductor device has a secure electrical connection between the bump and the metal pattern.

16 Claims, 9 Drawing Sheets

F I G. 2 (a)
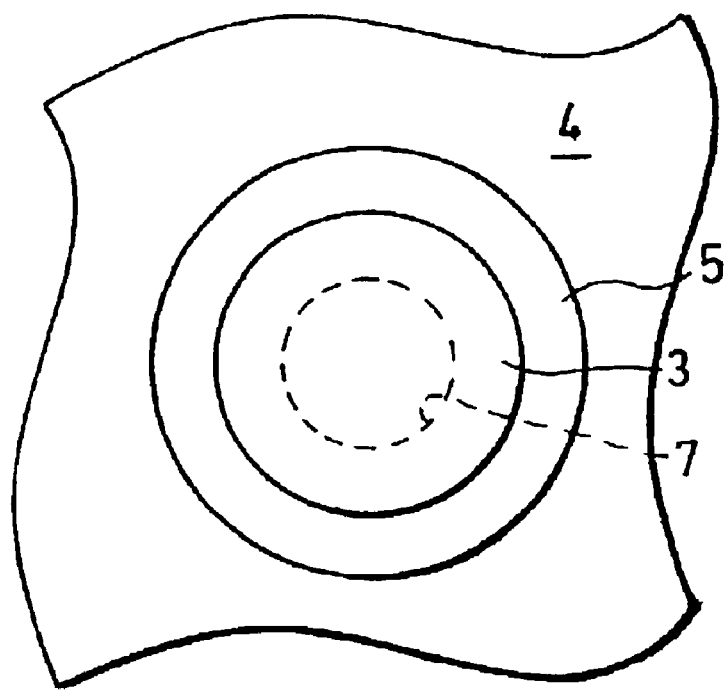
F I G. 2 (b)
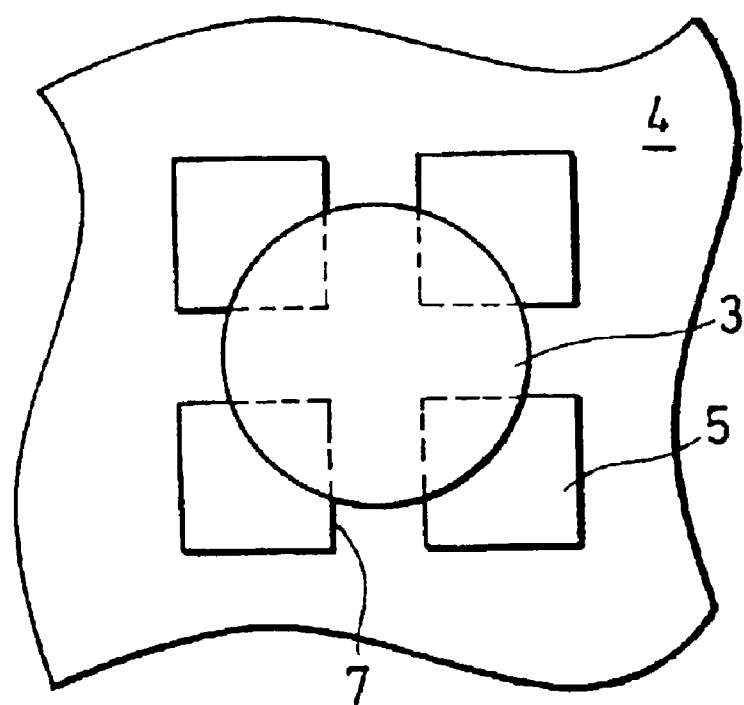

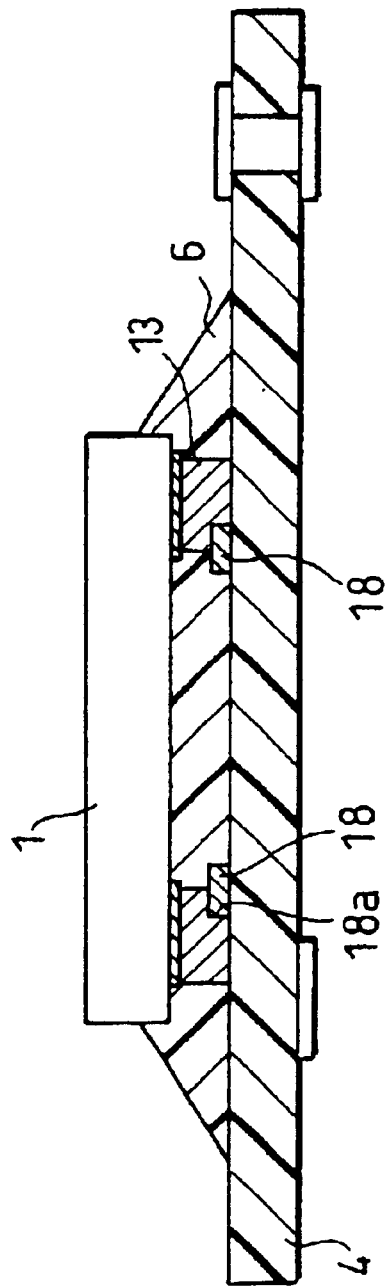
F I G. 5 (a)
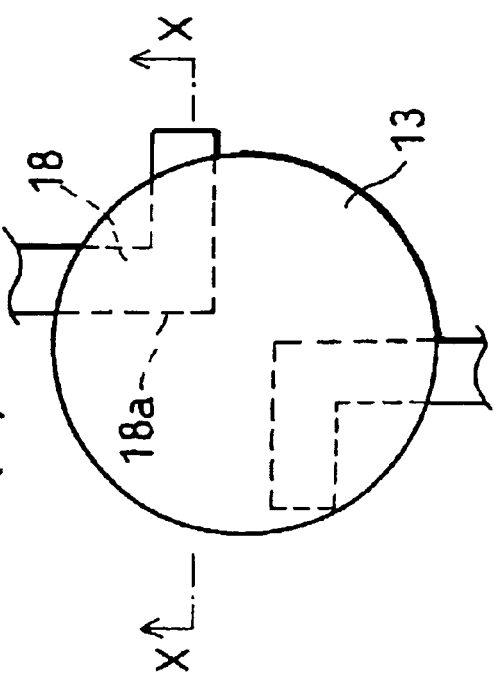
F I G. 5 (b)

METHOD OF MAKING SEMICONDUCTOR DEVICE WITH FLIP CHIP MOUNTING

This application is a divisional of U.S. patent application Ser. No. 09/886,035, filed Jun. 22, 2001, now abandoned the entire content of which is hereby incorporated by reference in this application.

FIELD OF THE INVENTION

The present invention relates to a semiconductor device and a manufacturing method thereof in which a bare semiconductor chip is flip chip mounted using a printed wiring substrate, and more particularly concerns those using FCB (Flip Chip Bonding).

BACKGROUND OF THE INVENTION

A flip chip mounting method is a method in which a bare chip is directly mounted on a substrate, instead of using a packaged IC (Integrated Circuit). Conventionally, as disclosed in Japanese Unexamined Patent Publications No. 11-284022/1999 (Tokukaihei 11-284022, 1999) and No. 11-345302/1999 (Tokukaihei 11-345302, 1999), for example, a bump on a chip and a metal pattern (also referred to as a "land") on a substrate are connected by pressing the protruding or hemispherical bump against the flat metal pattern from a side opposite to the bump-formed side of the chip.

More specifically, as shown in FIG. 10(a), in order to manufacture a semiconductor device 70, a gold bump 73 is formed on an input/output pad 72 on a bare chip 71 by means of wire bonding or gold plating. Next, the bare chip 71 on which the gold bump 73 is formed is faced down and mounted on a printed wiring substrate 74.

When mounting, a thermo-setting resin 76 is placed on a printed substrate pad 75 patterned on the printed wiring substrate 74, and the bare chip 71 is placed on the printed substrate pad 75, with its surface having the gold bump 73 facing down. Then, heat and pressure are applied from above to the bare chip 71, hardening the thermo-setting resin 76 between the bare chip 71 and the printed wiring substrate 74.

Thus, the printed wiring substrate 74, the thermo-setting resin 6, and the printed substrate pad 75 are connected by the pressure when they are pressed by the bare chip 71 having the gold bump 73, and specifically, in a condition that the printed substrate pad 75 is dented, for example, by a dent depth d.

In the conventional semiconductor device 70, as shown in FIG. 10(b), the area of the gold bump 73 in contact with the printed substrate pad 75 is always smaller than the area of the printed substrate pad 75. That is, in a conventional semiconductor device, the connection is obtained by pressing a small, protruding bump against a large, flat metal pattern.

Also in a conventional semiconductor device, a chip and a substrate may be pressed with heat applied, after a resin is filled in a spacing formed between them, or after a thermo-setting resin film, instead of a resin, is placed between them. Besides, there are no special requirements on the shape of a bump.

However, in the foregoing conventional semiconductor device and the manufacturing method thereof, even if the chip is pressed and fixed to the substrate, the bump just forms a round dent on the metal pattern, and the connection between them is not always satisfactory. Therefore, even if the chip and the substrate are fixed in this state via the thermo-setting resin between them, when another heat application is conducted in a later mounting process, the connection between the bump and the metal pattern might become unsatisfactory under the influence of a stress distortion due to the difference in the thermal expansion coefficient of each material.

For example, in the conventional semiconductor device 70 shown in FIGS. 10(a) and 10(b), when the bare chip 71 is mounted on the printed wiring substrate 74 but not fixed by a fixing jig, etc. and then heat is applied to the printed wiring substrate 74, the hardened thermo-setting resin 76 between the bare chip 71 and the printed wiring substrate 74 is expanded by heat, and the connection between the gold bump 73 on the bare chip 71 and the printed substrate pad 75 on the printed wiring substrate 74 gets easily opened. That is, since only a flat contact resistance between the gold bump 73 and the printed wiring substrate 74 works as a resistance to the thermal expansion of the thermo-setting resin 76, the gold bump 73 and the printed substrate pad 75 get separated, failing to withstand the thermal expansion.

As heat application is completed and the chip is cooled down, the separated gold bump 73 and the printed substrate pad 75 are fixed again, but not at the original position. As a result, the fixing strength of the gold bump 73 and the printed substrate pad 75 here is inferior to the original fixing strength, and the electrical connection tends to become unsatisfactory.

The reason is that, since the thermal expansion coefficient of the thermo-setting resin 76 is large, due to its shrinkage during cooling, the positional relationship between the gold bump 73 and the printed substrate pad 75 relatively deviates both in a vertical direction along the thickness of the chip, and in a horizontal direction along the surface of the chip. As heat application is completed and the chip is cooled down, the thermo-setting resin 76 and the printed substrate pad 75 shrink and the foregoing positional relationship is tried to be restored, but the original positional relationship is not always restored.

Consequently, there is a possibility that the gold bump 73 and the printed substrate pad 75 eventually have a break.

SUMMARY OF THE INVENTION

The present invention is made considering the foregoing conventional problems, and its object is to provide a semiconductor device having a secure electrical connection between a bump and a wiring pattern and a manufacturing method thereof.

In order to attain the above object, a semiconductor device of the present invention is a flip chip mounted semiconductor device including:

a semiconductor chip having a bump;

a substrate having a wiring pattern joined to the bump; and the wiring pattern having a stepped section formed within an area joined to the bump, wherein the bump also joins a side face of the stepped section of the wiring pattern.

According to the above structure, even if a horizontal force is exerted between the bump and the wiring pattern when heat is applied in a process after the flip chip mounting, the bump is restrained from moving in the horizontal direction by the side face of the stepped section of the wiring pattern. Therefore, a secure electrical connection between the bump and the wiring pattern can be obtained.

Further, in order to attain the above object, a flip chip mounted semiconductor device of the present invention includes:

a semiconductor chip having a bump; and a substrate having a wiring pattern joined to the bump, wherein when the substrate is seen from a side of the semiconductor chip, a contact area between the bump and the wiring pattern is smaller than an area of the bump in a direction of the substrate.

According to the above structure, the bump is joined to both the wiring pattern and the substrate so as to cover the metal pattern. As a result, even if a horizontal force is exerted between the bump and the metal pattern when heat is applied in a process after the flip chip mounting, the bump is restrained from moving in the horizontal direction by the side face of the wiring pattern. Therefore, a secure electrical connection between the bump and the wiring pattern can be obtained.

Furthermore, in order to attain the above object, a method for manufacturing a semiconductor device of the present invention includes the step of conducting flip chip mounting by pressing a semiconductor chip having a bump onto a wiring pattern formed on a substrate, the method for manufacturing a semiconductor device further includes the steps of:

i) forming a stepped section on the wiring pattern; and ii) joining the bump of the semiconductor chip also to a side face of the stepped section of the wiring pattern.

With this method, it is possible to manufacture the foregoing semiconductor device having a secure electrical connection between the bump and the wiring pattern.

For a fuller understanding of the nature and advantages of the invention, reference should be made to the ensuing detailed description taken in conjunction with the accompanying drawings.

BRIEF DESCRIPTION OF THE DRAWINGS

FIGS. 2(a) and 2(b) are plan views showing the positional relationship of a gold bump and a printed substrate pad of the foregoing semiconductor device. FIG. 2(a) shows a case in which the printed substrate pad, having a penetration hole, is formed in a circular shape, and FIG. 2(b) shows a case in which the printed substrate pad, having penetrating grooves, is formed in a square shape.

FIG. 3(a) is a cross-sectional view of a semiconductor device of the second embodiment, FIG. 3(b) is a plan view showing the positional relationship between a gold bump and a printed substrate pad which does not have a penetration hole, and FIG. 3(c) is a plan view showing the positional relationship between a gold bump and a printed substrate pad which has a penetration hole.

FIGS. 5(a) and 5(b) show another type of the second embodiment of the semiconductor device and the manufacturing method thereof in accordance with the present invention. FIG. 5(a) is a cross-sectional view of a semiconductor device including the section taken along a line X—X in FIG. 5(b), and FIG. 5(b) is a plan view showing the positional relationship of the gold bump and another type of printed substrate pads.

FIG. 10(a) is a cross-sectional view, and FIG. 10(b) is a plan view showing the positional relationship between a gold bump and a printed substrate pad.

DESCRIPTION OF THE EMBODIMENTS

[First Embodiment]

Figure 1:
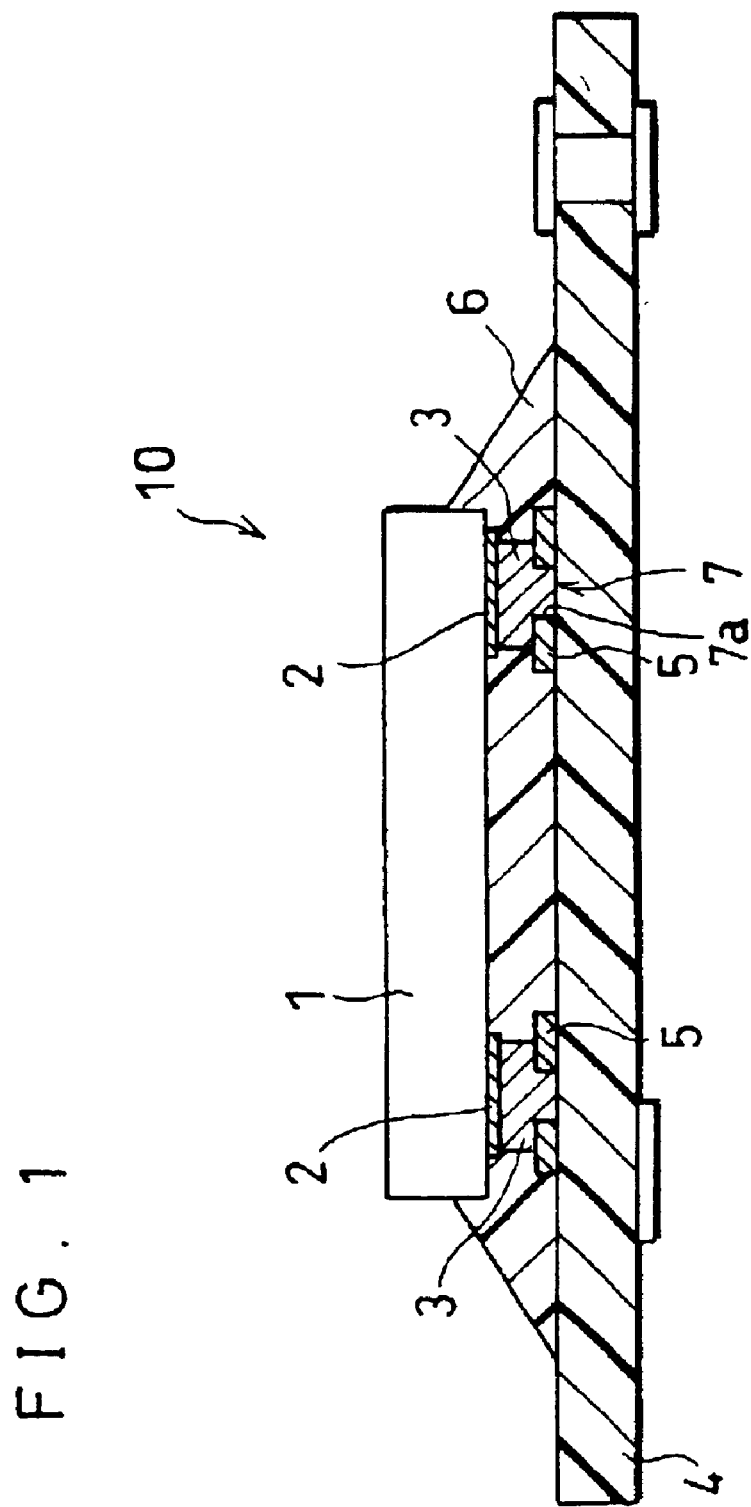
FIG. 1, which shows one embodiment of a semiconductor device and a manufacturing method thereof in accordance with the present invention, is a cross-sectional view of the semiconductor device.

Referring to FIGS. 1, 2(a), and 2(b), the following description will discuss one embodiment of the present invention.

As shown in FIG. 1, in a semiconductor device 10 of the present embodiment, a semiconductor chip 1 having electrodes 2, and a printed wiring substrate (substrate) 4 having printed substrate pads (wiring pattern, metal pattern) 5, are flip chip mounted by gold bumps (bumps) 3 lying between each of the electrodes 2 and printed substrate pads 5. In addition, the semiconductor chip 1 and the printed wiring substrate 4 are fixed with a thermo-setting resin 6 (resin).

A method for manufacturing the semiconductor device 10 having the foregoing structure will be explained.

First, as shown in FIG. 1, each electrode 2 is formed on the semiconductor chip 1. Then, the gold bump 3 is formed on each electrode 2. The gold bump 3 is formed in a protruding or hemispherical shape by means of wire bonding or metal plating. Here, the gold bump 3 is made of gold, a material softer than that of the printed substrate pad 5 which will be mentioned later. However, the material of the bump is not limited to gold, but may be other materials softer than that of the printed substrate pad 5, such as solder, for example.

Next, the thermo-setting resin 6 is placed on the printed substrate pad 5 patterned on the printed wiring substrate 4, and the semiconductor chip 1 is placed on the printed wiring substrate 4 with its surface having the gold bump 73 facing down. Then, heat and pressure are applied from above to the semiconductor chip 1, hardening the thermo-setting resin 6 between the semiconductor chip 1 and the printed wiring substrate 4.

Thus, the semiconductor chip 1 is flip chip mounted on the printed wiring substrate 4.

Here, in the foregoing flip chip mounting, the thermo-setting resin 6 is used between the semiconductor chip 1 and the printed wiring substrate 4 to ensure the strength between the semiconductor chip 1 and the printed wiring substrate 4, since the strength cannot be mechanically maintained just by the connection of the gold bump 3 and the printed substrate pad 5.

The pressure condition in the foregoing flip chip mounting is 10 to 150 grams per bump, for example. However, the pressure of not less than 75 grams is desirable, according to the results of experiments.

As for the condition of the temperature applied to the thermo-setting resin 6, it is preferable to apply 190° C. for 5 to 10 seconds, for example, although it varies according to the type of the resin used.

Here, it is possible to use a thermo-setting resin film, for example, as the foregoing thermo-setting resin 6. Especially, when using a thermo-setting resin film, it is preferable to use an anisotropic conductive adhesive, that is, a resin in the form of an anisotropic conductive film [hereinafter referred to as an ACF (Anisotropic Conductive Film)].

This ACF is the resin containing conductive particles. Therefore, by placing the ACF between the bump 3 and the printed substrate pad 5 and applying pressure, electrical connection is ensured via conductive particles in the direction the bump 3 and the printed substrate pad 5 are pressed, and insulation between each printed substrate pad 5 is maintained by the resin in a horizontal direction of the printed substrate pad 5.

Thus, by using the ACF, problems caused by thermal expansion can be suppressed to some extent, compared with the case in which a normal resin without having conductive particles is used. In other words, the ACF is more effective than normal resins without having conductive particles on the problems related to thermal expansion, as it contains conductive particles.

Meanwhile, in the manufacturing method of the semiconductor device 10 of the present embodiment, a penetration hole 7 is formed in the printed substrate pad 5 on the printed wiring substrate 4, on a surface in contact with the each gold bump 3 (by forming the penetration hole 7, the printed substrate pad 5 comes to have an inner surface, which becomes a stepped section). That is, the penetration hole 7 is formed on a surface where the gold bump 3 and the printed substrate pad 5 contact horizontally, as a hole penetrating the printed substrate pad 5.

By forming the penetration hole 7 in the printed substrate pad 5, when the gold bump 3 is joined to the printed substrate pad 5, the gold bump 3 gets into the penetration hole 7 as it is made of gold and is softer than the printed substrate pad 5. As a result, the gold bump 3 is joined to at least a side face 7a of the penetration hole 7. In other words, the gold bump 3 is pressed into the penetration hole 7, which is a stepped section, of the printed substrate pad 5 and deformed, providing secure connection between them.

With this connection, even if heat is applied to the flip chip mounted semiconductor device 10 in a later process, the positional relationship between the gold bump 3 and the printed substrate pad 5 is not changed.

That is, in manufacturing the semiconductor device 10, there is a process in which temperature is increased again after the semiconductor chip 1 is mounted on the printed substrate pad 5.

When heat is applied again to the thermo-setting resin 6 hardened between the printed wiring substrate 4 and the semiconductor chip 1, the thermo-setting resin 6 is expanded by heat, the distance between the semiconductor chip 1 and the printed wiring substrate 4 is widened according to the thermal expansion coefficient of the thermo-setting resin 6, and the gold bump 3 and the printed substrate pad 5 get separated. Specifically, heat application is normally conducted at 190° C. for 10 seconds or less, for example, as mentioned above, but sometimes the temperature is increased up to 280° C., and the thermo-setting resin 6 is expanded in such a case. At this time, the printed wiring substrate 4 is also expanded by heat. However, the expansion of the semiconductor chip 1 is negligible. To be specific, the difference in linear expansion coefficients is 100 times or more. Therefore, the positional relationship between the gold bump 3 and the printed substrate pad 5 is relatively deviated both in a facing direction (the direction of thickness of the chip) and in a horizontal direction (the direction along the surface of the chip). As heat application is completed and the chip is cooled down, the thermo-setting resin 6 and the printed wiring substrate 4 shrink and the foregoing positional relationship is tried to be restored, but conventionally, the original positional relationship is not always restored.

The change in the contact resistance between the gold bump 3 and the printed substrate pad 5 during the above period has been confirmed, and it is found that the higher the temperature, the higher the resistance, and the lower the temperature, the smaller the resistance. However, in a conventional structure, the resistance sometimes becomes higher than before when the temperature is lowered again. It is considered that this occurs due to a break between the gold bump 3 and the printed substrate pad 5.

However, in the present embodiment, the penetration hole 7 is formed in the printed substrate pad 5, and the gold bump 3 gets into the penetration hole 7.

Therefore, even if the gold bump 3 and the printed substrate pad 5 get separated temporarily in their facing direction, the gold bump 3 is restrained from moving by the penetration hole 7 in a horizontal direction of the printed substrate pad 5 and thus it does not move horizontally. Consequently, when the temperature is lowered in this state, even if the thermo-setting resin 6 is influenced by the pressure stress between the printed wiring substrate 4 and the semiconductor chip 1, the gold bump 3 in the penetration hole 7 and the thermo-setting resin 6 get hardened at the original spot, so the gold bump 3 can maintain the position originally mounted on the printed substrate pad 5.

In accordance with the foregoing principle, it can be considered that the gold bump 3 is connected to the printed substrate pad 5 in such a manner that it is joined to an end section of the penetration hole 7 of the printed substrate pad 5. More precisely, the gold bump 3 is also considered to be joined to the side face 7a of the penetration hole 7. By the effect of the side face junction, the semiconductor chip 1 is considered to be restrained from moving.

Here, in the present embodiment, as mentioned above, the stepped section is formed as the penetration hole 7, and the gold bump 3 gets into the printed substrate pad 5 and contacts the printed wiring substrate 4, but the embodiment is not limited to this structure.

For example, the stepped section may not be the penetration hole 7 but may be formed as a hole not penetrating but with a step. That is, the stepped section may take a form as far as the gold bump 3 gets into the printed substrate pad 5 and the gold bump 3 is at least joined to the side face of the hole. Also with this structure, the original junction position of the gold bump 3 and the printed substrate pad 5 is maintained when the temperature is returned to the normal temperature after the second heat application.

Incidentally, it is desirable for the side face of the foregoing stepped section to be formed in parallel (or virtually parallel) to the facing direction of the semiconductor chip 1 and printed wiring substrate 4. With this structure, it becomes possible to effectively restrain the semiconductor chip 1 from moving in a horizontal direction (the direction vertical to the facing direction of the semiconductor chip 1 and printed wiring substrate 4).

In addition, in the present embodiment, as shown in FIG. 2(*a*), the gold bump 3 is formed in a virtually circular shape, and the diameter of the gold bump 3 is formed smaller than the diameter of the printed substrate pad 5 when looking at them from the top. Concerning this point, the present embodiment is different from a second embodiment which will be described later. Here, the wiring of the printed substrate pad 5 is not illustrated but extended from its one end to the end of the printed wiring substrate 4, along the upper surface of the printed wiring substrate 4.

Besides, in the present embodiment, the printed substrate pad 5 is formed in a virtually circular shape as mentioned above, but the shape is not limited to circular but can be a virtually square, for example, as shown in FIG. 2(b), and the penetration hole 7 can be formed in a cross shape in this case. That is, the penetration hole 7 is made up of penetrating grooves. Also in this case, the virtually square shape of the printed substrate pad 5 is formed to be larger than the virtually circular shape of the gold bump 3.

As a result, in the manufacturing method of the foregoing semiconductor device 10, when fixing the printed substrate pads 5, which are lands for mounting a chip on the printed wiring substrate 4, and the semiconductor chip 1 having bump connection terminals by means of a flip chip mounting method, using an ACF or a resin without containing conductive particles, the characteristic form of the printed substrate pad 5 enables the gold bump 3 formed on each electrode 2 of the semiconductor chip 1 to get into the printed substrate pad 5, which is a chip mounting land having the above characteristic pattern form, thus contributing to the maintenance, improvement, and stabilization of the connection reliability after the connection.

As has been discussed, in the semiconductor device 10 of the present embodiment and the manufacturing method thereof, the semiconductor chip 1 having the electrodes 2 is flip chip mounted on the printed substrate pads 5 on the printed wiring substrate 4, by the gold bump 3 at each electrode 2, and the semiconductor chip 1 and the printed wiring substrate 4 are fixed with the thermo-setting resin 6.

Meanwhile, in a conventional semiconductor device, since a bump is joined to a flat metal pattern just by pressure, there is a possibility that, when heat is applied to the conventional semiconductor device in a process after the flip chip mounting, a resin gets softened and the connection surface between the bump and the metal pattern might deviate from the original position, thus the electrical connection between the bump and the metal pattern might become unsatisfactory.

However, in the semiconductor device 10 of the present embodiment, the penetration hole 7 is formed in the printed substrate pad 5 within the area joined to each gold bump 3, and the area joined to each gold bump 3 includes the side face 7a of the penetration hole 7 in the printed substrate pad 5.

Therefore, even if the thermo-setting resin 6 gets softened when heat is applied in a process after the flip chip mounting, and a horizontal force is exerted between the gold bump 3 and the printed substrate pad 5, the gold bump 3 is restrained from moving in the horizontal direction by the side face 7a of the penetration hole 7 in the printed substrate pad 5.

As a result, even when cooled down after the heat application, the gold bump 3 and the printed substrate pad 5 maintain the original junction condition at the original position without being deformed.

Therefore, the semiconductor device 10 having a secure electrical connection between the gold bump 3 and the printed substrate pad 5 and the manufacturing method thereof can be provided.

In the semiconductor device 10 of the present embodiment, a tip of the printed substrate pad 5 which contacts the gold bump 3 is formed in a semicircular shape with the penetration hole 7 in its center.

With this shape, the tip of the printed substrate pad 5 can fit the gold bump 3 formed in a circular shape. Besides, the junction section of the gold bump 3 can be formed on the side face 7a of the penetration hole 7 in the printed substrate pad 5.

Therefore, the semiconductor device 10 having a secure electrical connection between the gold bump 3 and the printed substrate pad 5 and the manufacturing method thereof can be provided.

In addition, in the manufacturing method of the semiconductor device 10 of the present embodiment, an ACF is used as the thermo-setting resin 6, and when the semiconductor chip 1 and the printed wiring substrate 4 are fixed using the foregoing ACF, the semiconductor chip 1 having the gold bump 3 on each electrode 2 is pressed onto the printed wiring substrate 4 with heat applied, via the foregoing ACF.

Thus, when fixing the semiconductor chip 1 and the printed wiring substrate 4 using the foregoing ACF, the problem associated with the thermal expansion can be suppressed as compared to the case of adopting other resin.

Therefore, in the case where the thermo-setting resin 6 including the ACF gets softened when heat is applied in a process after the flip chip mounting, and a horizontal force is exerted between the gold bump 3 and the printed substrate pad 5, the horizontal force exerted between the gold bump 3 and the printed substrate pad 5 can be suppressed.

As a result, even when cooled down after the heat application, the gold bump 3 and the printed substrate pad 5 securely maintain the original junction condition at the original position without being deformed.

Therefore, the semiconductor device 10 having a secure electrical connection between the gold bump 3 and the printed substrate pad 5 and the manufacturing method thereof can be provided.

[Second Embodiment]

Referring to FIGS. 3(a) through 3(c), 4, 5(a), and 5(b), the following description will discuss another embodiment of the present invention. The members having the same structure (function) as those in the above-mentioned first embodiment will be designated by the same reference numerals and their description will be omitted.

The characteristic structures described in the foregoing first embodiment will also be combined and applied to the present embodiment.

In the foregoing first embodiment, the size of the gold bump 3 is smaller than that of the printed substrate pad 5, when looking at them from the top.

Figure 3A:
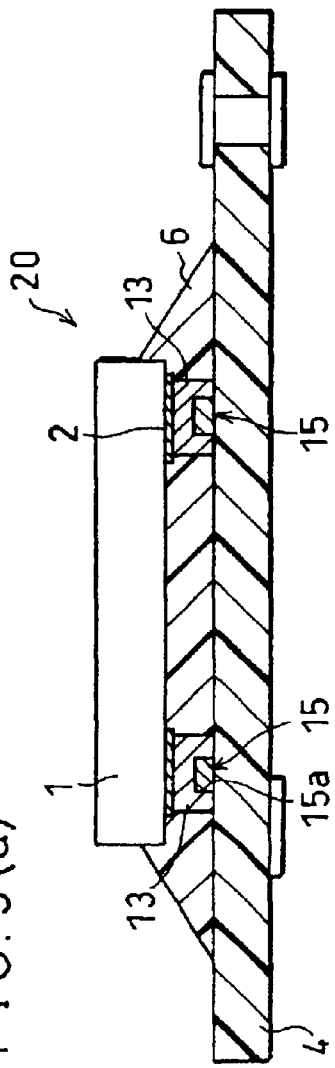
FIGS. 3(a) through 3(c) show a second embodiment of the semiconductor device and a manufacturing method thereof in accordance with the present invention.
Figure 3C:
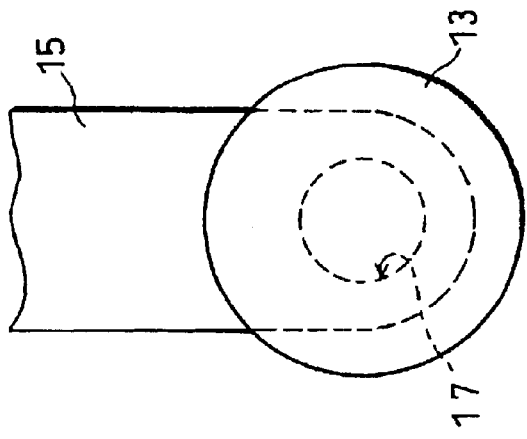
Figure 3B:
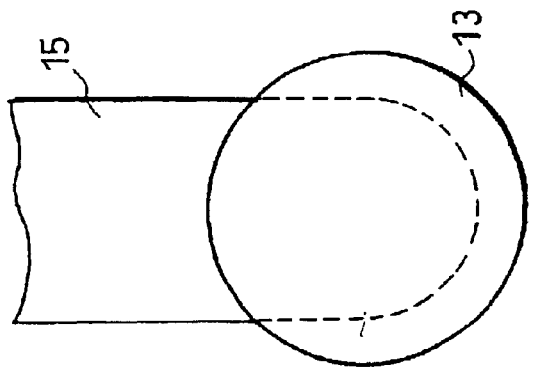

However, in a semiconductor device 20 of the present embodiment, as shown in FIGS. 3(a) and 3(b), the size of each gold bump 13 is larger than that of a printed substrate pad 15, when looking at the printed wiring substrate 4 from the top.

Therefore, in the present embodiment, the penetration hole 7 adopted in the first embodiment is not formed in the printed substrate pad 15, and an external side face 15a of the printed substrate pad 15 has a function as a stepped section. In other words, the printed substrate pad 15 has the side face (external surface) 15a, formed parallel (or virtually parallel) to a facing direction of the semiconductor chip 1 and the printed wiring substrate 4, in a periphery of its surface joined to the gold bump 13. With this side face 15a is formed the stepped section which effectively restrains the semiconductor chip 1 from moving in a horizontal direction (a direction perpendicular to the direction in which the semiconductor chip 1 and the printed wiring substrate 4 face one another).

It should be noted here that as shown in FIG. 3(c), it is possible to form a penetration hole 17 in the printed substrate pad 15 of the present embodiment. In this way, in an internal contact area of the gold bump 13 and the printed substrate pad 15, it is possible to achieve the same effects as achieved from those achieved from the structure of the first embodiment in which the penetration hole 7 serves as the stepped section.

In the present embodiment, the gold bump 13 bites on the printed substrate pad 15 so as to cover the outside of the printed substrate pad 15, and thus the gold bump 13 is joined to at least the external side face 15a of the printed substrate pad 15.

Also with this structure, even if the gold bump 13 and the printed substrate pad 15 get separated temporarily in their facing direction, the gold bump 13 is restrained from moving by the side face 15a in a horizontal direction of the printed substrate pad 15 and thus its horizontal movement can be prevented. Therefore, in the cooling process where the gold bump 13 and the printed substrate pad 15 get once separated in the direction they face one another, even if the thermo-setting resin 6 is affected by the pressure stress between the semiconductor chip 1 and the printed wiring substrate 4, the gold bump 13 can remain in its original position on the printed substrate pad 15, as its movement in a horizontal direction is restrained by the side face 15a.

In addition, the printed substrate pad 15 of the present embodiment is formed smaller than the gold bump 13.

Therefore, the gold bump 13, softer than the printed substrate pad 15, easily bites on the protruding printed substrate pad 15 when connecting the gold bump 13 to the printed substrate pad 15 by pressing the gold bum 13 onto the printed substrate pad 15.

It is therefore possible to press the gold bump 13 onto the printed substrate pad 15 with lower pressure than that required in a conventional device, as is clear from the results of experiments (to be described later).

Figure 4:
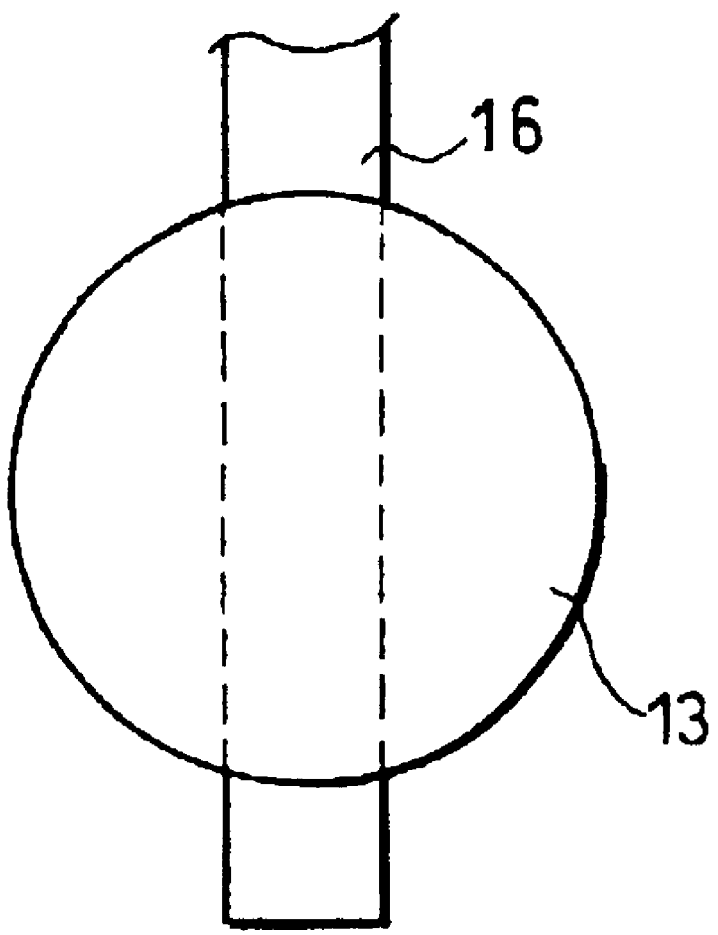
FIG. 4 is a plan view-showing the positional relationship between the gold bump and another type of printed substrate pad in the foregoing semiconductor device and manufacturing method thereof.

Here, in the foregoing embodiment, the printed substrate pad 15 has a circular tip which is entirely covered with the gold bump 13, but the present invention is not limited to this structure. For example, as shown in FIG. 4, a printed substrate pad 16 may be formed in a narrow rectangular shape and its tip may protrude from the gold bump 13. It is needless to mention that the tip is not necessarily protrude from the gold bump 13.

Further, as shown in FIGS. 5(a) and 5(b), a printed substrate pad 18 may be shaped like a letter L and only a side face 18a, one side of the printed substrate pad 18, may be joined to the gold bump 13. The printed substrate pad is not limited to L-shaped, but it may take other shapes as far as it is formed in a polygon shape within the area joined to each gold bump 3, in general. Thus a stepped section can be formed in the printed substrate pad, and a section joined to the gold bump can be provided on the side face of the stepped section.

Further, in the structure shown in FIG. 5(b), the area of the printed substrate pad 18, joined to one gold bump 13, is divided into a plurality of pieces, and each of the plurality of pieces has the stepped section (side face 18a).

As discussed above, the semiconductor device 20 of the present embodiment is arranged such that, when the printed wiring substrate 4 is seen from the side of the semiconductor chip 1, the area where the gold bump 13 contacts the printed substrate pad 15 is smaller than the entire contact area of the gold bump 13 in the direction of the printed wiring substrate 4 [See FIGS. 3(a) through 3(c)].

That is, in a conventional semiconductor device, the printed substrate pad is formed larger than the gold bump.

In contrast, in the present embodiment, the printed substrate pad 15 is formed smaller than the gold bump 13, contrary to the conventional device.

Therefore, the gold bump 13 is joined to both the printed substrate pad 15 and the printed wiring substrate 4 so as to cover the printed substrate pad 15. Therefore, the gold bump 13 also joins the side face 15a of the printed substrate pad 15.

As a result, even if the thermo-setting resin 6 gets softened when heat is applied in a process after the flip chip mounting, and a horizontal force is exerted between the gold bump 13 and the printed substrate pad 15, the gold bump 13 is restrained from moving in a horizontal direction by the side face 15a of the printed substrate pad 15.

Therefore, even when cooled down after the heat application, the gold bump 13 and the printed substrate pad 15 maintain the original junction condition at the original position without being deformed.

In addition, since the gold bump 13 is generally made of a softer material than that of the printed substrate pad 15, the structure that the printed substrate pad 15 is smaller than the gold bump 13, as in the present embodiment, enables the gold bump 13 to bite on the printed substrate pad 15 more firmly with the pressure in the same level as in a conventional device, providing more satisfactory electrical connection.

Therefore, the semiconductor device 20 having a secure electrical connection between the gold bump 13 and the printed substrate pad 15 can be provided.

In addition, as shown in FIG. 3(c), the semiconductor device 20 of the present embodiment is arranged such that the tip of the printed substrate pad 15 joined to the gold bump 13 is formed in a semicircular shape with the penetration hole 17 in its center.

With this structure, the tip of the printed substrate pad 15 can be covered with the gold bump 13 so as to fit the circular-formed gold bump 13. Besides, the gold bump 13 also joins the side face of the printed substrate pad 15, that is, the side face of the penetration hole 17.

Therefore, the semiconductor device 20 having a secure electrical connection between the gold bump 13 and the printed substrate pad 15 can be provided.

Further, as shown in FIG. 4, the semiconductor device 20 of the present embodiment is arranged such that the printed substrate pad 16 which contacts each gold bump 13 can be formed in a rectangular shape crossing the surface in contact with the gold bump 13.

With this structure, the printed substrate pad 16 crossing the circular-formed gold bump 13 can be covered with the gold bump 13. Besides, the gold bump 13 also joins the side face of the printed substrate pad 16.

Therefore, the semiconductor device 20 having a secure electrical connection between the gold bump 13 and the printed substrate pad 16 can be provided.

Furthermore, as shown in FIG. 5(b), the semiconductor device 20 of the present embodiment is arranged such that the printed substrate pad 18 which contacts each gold bump 13 can be formed in a polygon shape within the surface in contact with the gold bump 13.

With this structure, the printed substrate pad 18 can be covered with the gold bump 13, within the area of the circular-formed gold bump 13. Besides, the gold bump 13 also joins the side face of the printed substrate pad 18.

Therefore, the semiconductor device 20 having a secure electrical connection between the gold bump 13 and the printed substrate pad 18 can be provided.

Here, the present invention is not limited to the foregoing embodiments, and various alternation can be made within the scope of the present invention. For example, in the second embodiment, the semiconductor chip 1 having each electrode 2 and the printed wiring substrate 4 having the printed substrate pads 15 are flip chip mounted just by pressure [See FIG. 3(a)].

However, the present invention is not limited to this structure. For instance, ultrasound can be used to join the gold bump 13 to the printed substrate pad 15, which is so called an ultrasonic welding.

In other words, the gold bump 13 and the printed substrate pad 15 are fixed using ultrasound in order to further stabilize the connection between them. Specifically, when ultrasonic vibrations are applied to the gold bump 13 together with a constant pressure, a plastic flow is generated in the gold bump 13, in the same way as in the case under a high temperature. Then the oxide films on the respective metal boundary surfaces of the gold bump 13 and the printed substrate pad 15 are destroyed, and new surfaces are contacted and joined. Thus, a firm junction is ensured.

Here, an ultrasonic welding can work more effective if point contact is provided between elements to be welded. Therefore, it is desirable to form the printed substrate pad 15 to be a sharp-pointed projection, in a section where the gold bump 13 and the printed substrate pad 15 contact each other.

Regarding this point, in the second embodiment, the printed substrate pad 15 is formed smaller than the gold bump 13 within the area joined to the gold bump 13. Therefore, since the contact section is structurally smaller than that of a conventional device, the effect of ultrasound that its power is concentrated to a smaller area can be further enhanced in this structure. That is, the gold bump 13 and the printed substrate pad 15 are related in such a manner that the printed substrate pad 15 protrudes into the gold bump 13, which provides a smaller contact area than in the case of the gold bump 13 and a conventional flat printed substrate pad, allowing an easy ultrasonic welding with low pressure and low power.

It is also possible in the first embodiment to connect the gold bump 3 and the printed substrate pad 5 using ultrasonic vibrations, and a securer junction can, be achieved in such a case (See FIG. 1).

However, when using ultrasound, it is desirable to seal the elements with a resin after the connection of the gold bump 13 is completed.

The reason why the elements are sealed with a resin after the connection of the gold bump 13 is completed is that, if ultrasound is used after the elements are sealed with a resin, it prevents the resin from hardening and it accelerates a deviation of the gold bump 13 and the printed substrate pad 15 in a horizontal direction, thus producing adverse effects.

As has been discussed, in the manufacturing method of the semiconductor device 20 in the present embodiment, each gold bump 13 on the semiconductor chip 1 and the printed substrate pad 15 on the printed wiring substrate 4 are joined using ultrasonic vibrations, and a spacing formed between the semiconductor chip 1 and the printed wiring substrate 4 is sealed with a resin.

Since ultrasonic vibrations are utilized to join each gold bump 13 and each printed substrate pad 15, the junction between the two elements is ensured.

Therefore, the method for manufacturing the semiconductor device 20 having a secure electrical connection between the gold bump 13 and the printed substrate pad 15 can be provided.

[Third Embodiment]

Figure 6:
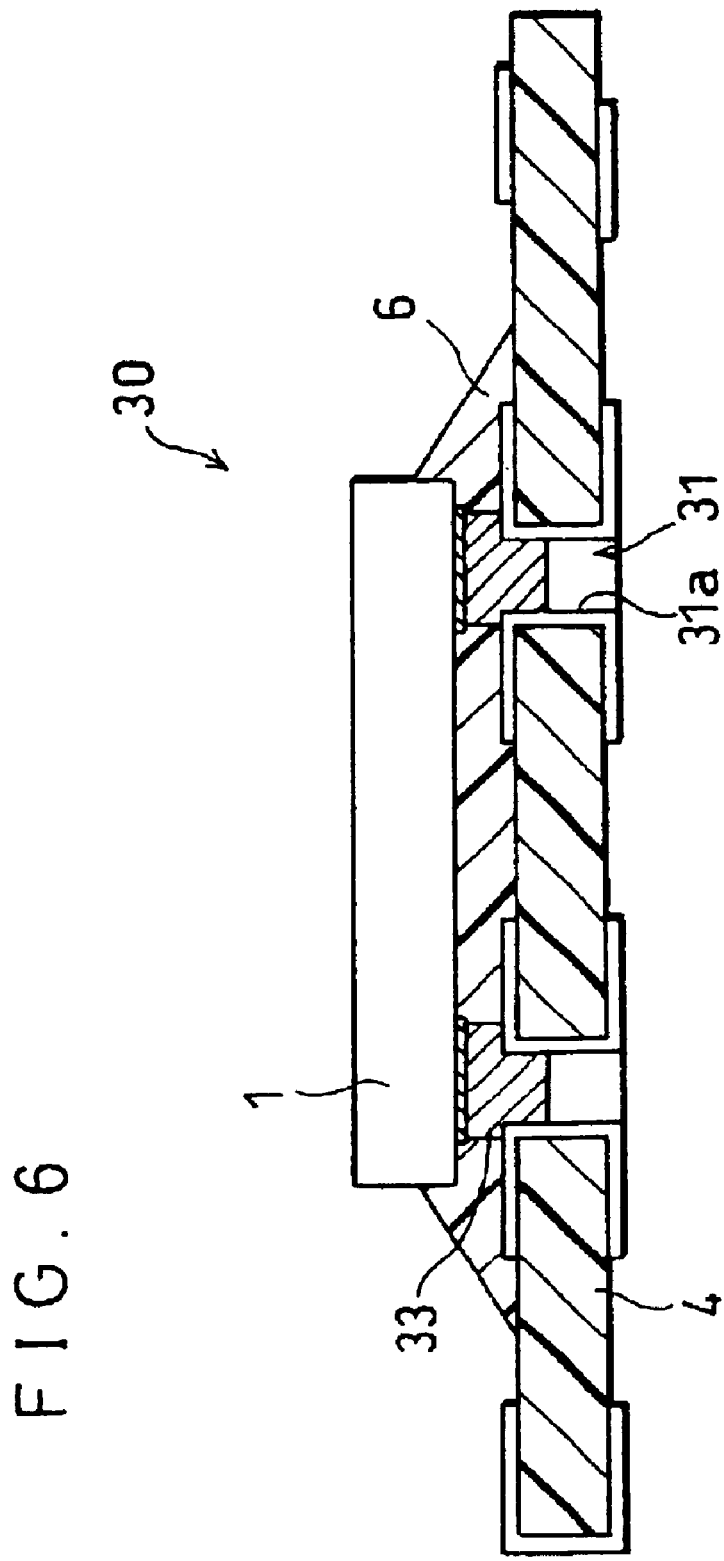
FIG. 6, which shows a third embodiment of the semiconductor device and a manufacturing method thereof in accordance with the present invention, is a cross-sectional view showing a semiconductor device having through holes.
Figure 7:
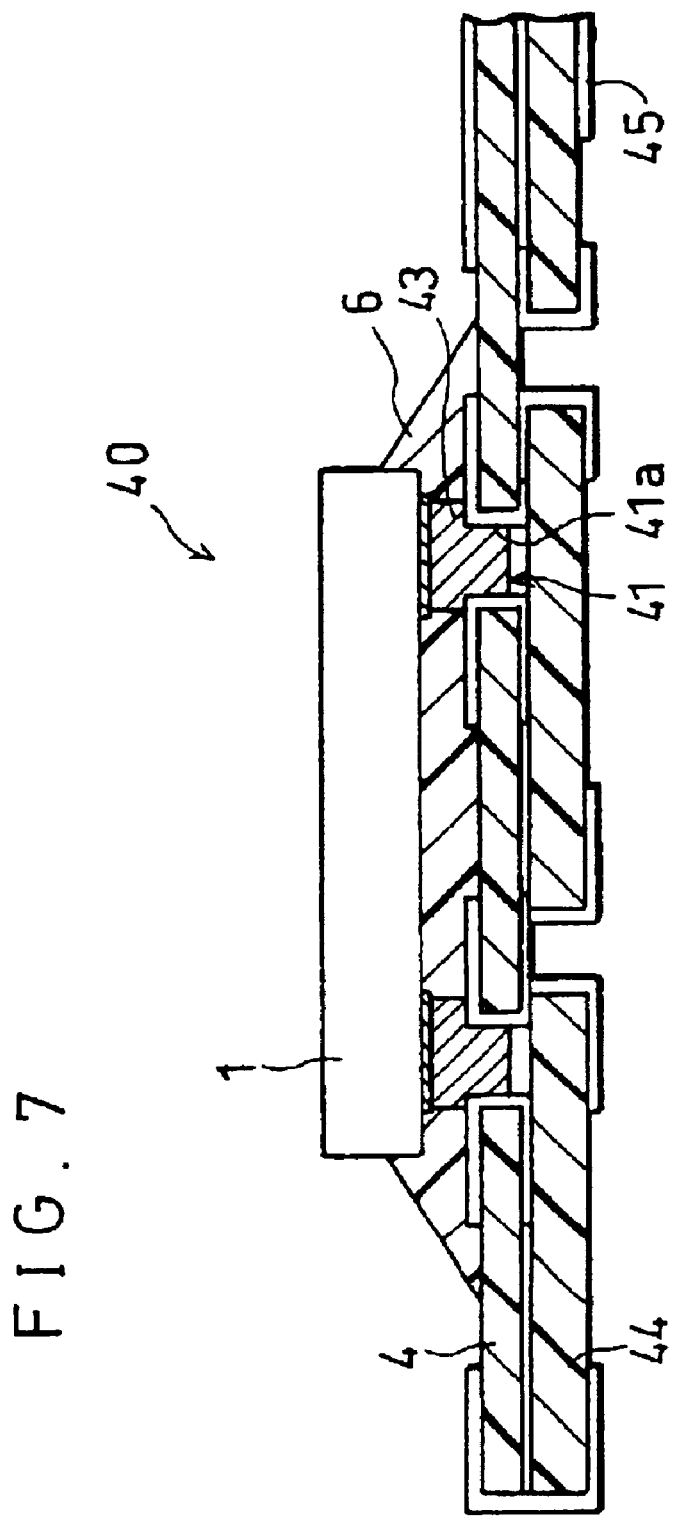
FIG. 7, which shows another type of a third embodiment of the semiconductor device and a manufacturing method thereof in accordance with the present invention, is a cross-sectional of a semiconductor device having via holes.

Referring to FIGS. 6 and 7, the following description will discuss another embodiment of the present invention. The members having the same structure (function) as those in the above-mentioned first and second embodiments will be designated by the same reference numerals and their description will be omitted.

In addition, the characteristics described in the foregoing first and second embodiments will also be combined and applied to the present embodiment.

In a semiconductor device 30 of the present embodiment, through holes 31 are formed in the printed wiring substrate 4, as shown in FIG. 6. Here, the printed wiring substrate 4 shown in the figure is a single-layer substrate, but it may be a multilayer substrate with the through hole 31 penetrating all the layers.

By the foregoing through hole 31, it is possible to output signals and the like from a rear side of the printed wiring substrate 4 to an external device.

In addition, as shown in FIG. 7, in a semiconductor device 40, via holes 41 are formed in the printed wiring substrate 4. Besides, under the printed wiring substrate 4, another printed wiring substrate 44 is formed on which printed substrate pads 45 are provided. Therefore, the semiconductor device 40 has a so-called built-up multilayer printed wiring substrate comprising the printed wiring substrate 4 and the printed wiring substrate 44. That is, the foregoing via hole 41 is a hole for a via which connects the wiring of each printed wiring substrate of a multilayer substrate. Here, the difference between the through hole 31 and the via hole 41 is that, while the through hole 31 is a penetrating hole, the via hole 41 penetrates at least only one layer but does not penetrate all the layers of a multilayer wiring substrate.

Thus, also in the case that the through hole 31 or the via hole 41 is formed, a gold bump 33 or 43 is restrained from moving by a side face 31a or 41a of the through hole 31 or the via hole 41, by pressing the gold bump 33 or 43 into the inside of the through hole 31 or via hole 41, as shown in the figures.

As a result, even if the thermo-setting resin 6 is influenced by the pressure stress between the printed wiring substrate 4 and the semiconductor chip 1 when the temperature is lowered after the second heat application, the gold bump 33 or 43 can maintain the position originally mounted on the through hole 31 or the via hole 41, as its movement is restrained by the side face 31a or 41a of the through hole 31 or the via-hole 41.

In addition, when using the printed wiring substrate 4 having the through hole 31 or the via hole 41 for the junction with the gold bump 33 or 43, there is no need for a redesign, as the conventional technology of the through hole 31 or the via hole 41 can be adopted unchanged, which is effective both in terms of design and material preparation and achieves total cost reduction.

As discussed above, in the semiconductor device 30 of the present embodiment, a metal pattern contacting each gold bump 33 is made up of a land for a through hole of the printed wiring substrate 4, that is, the through hole 31 (See FIG. 6).

Therefore, since the technology of and the material for the through hole 31, which is widely used in the printed wiring substrate 4, can be used unchanged, cost reduction is achieved, and it is possible to provide the semiconductor device 30 having a secure electrical connection between the through hole 31 and the gold bump 33 utilizing a stepped section of the through hole 31.

Besides, in the semiconductor device 40 of the present embodiment, a metal pattern contacting each gold bump 43 is made up of a land for a via hole of the printed wiring substrate 4, that is, the via hole 41 (See FIG. 7).

Therefore, since the technology of and the material for the via hole 41, which is widely used in the printed wiring substrate 4, can be used unchanged, cost reduction is achieved, and it is possible to provide the semiconductor device 40 having a secure electrical connection between the via hole 41 and the gold bump 43 utilizing a stepped section of the via hole 41.

EXPERIMENT EXAMPLE

Next, the following description will describe the result of an experiment concerning the pressure connection of the gold bump 13, conducted, for example, on the semiconductor device 20 shown in FIG. 3, described in the second embodiment, under different pressures. The same experiment was also conducted on a conventional device, and the result is compared with that of the present embodiment.

Experiment Example 1

Figure 8:
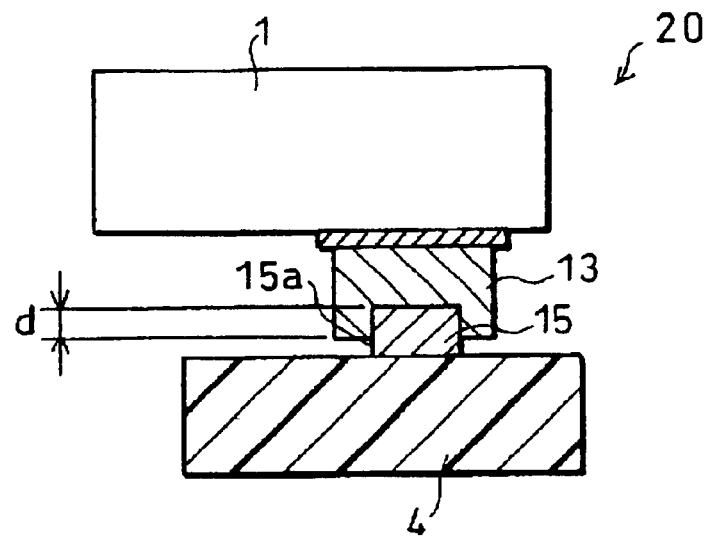
FIG. 8 is a cross-sectional view showing a semiconductor-device in a state under experiment, when the experiment is conducted using the semiconductor device shown in 3(a) and 3(b).

As shown in FIG. 8, when the area of the printed substrate pad 15 is smaller than that of the gold bump 13 formed on the semiconductor chip 1, a dent depth of the gold bump 13 against the printed substrate pad 15 was measured when connection pressures of 0.49 N/bump (50 gh/bump), 0.98 N/bump (100 gh/bump), and 2.94 N/bump (300 gh/bump) were applied respectively from an upper surface of the semiconductor chip 1 in a condition that the temperature was increased to a constant temperature.

In the experiment, after each connection pressure was applied to the upper surface of the semiconductor chip 1, the gold bump 13 was removed from the printed substrate pad 15, and the dent depth d formed on the printed substrate pad 15 was measured.

As a consequence, the result shown in Table 1 was obtained. When the gold bump 13 was removed from the printed wiring substrate 4, the gold bump 13 was dented so that the impression of the printed wiring pad 15 remained on the gold bump 13.

TABLE 1

| CONNECTION PRESSURE | DENT DEPTH d ON GOLD BUMP MADE BY PRINTED SUBSTRATE PAD |
|---|---|
| 0.49 N/bump (50 gf/bump) | 5 μm |
| 0.98 N/bump (100 gf/bump) | 10 μm |
| 2.94 N/bump (300 gf/bump) | 15 μm |

Figure 9:
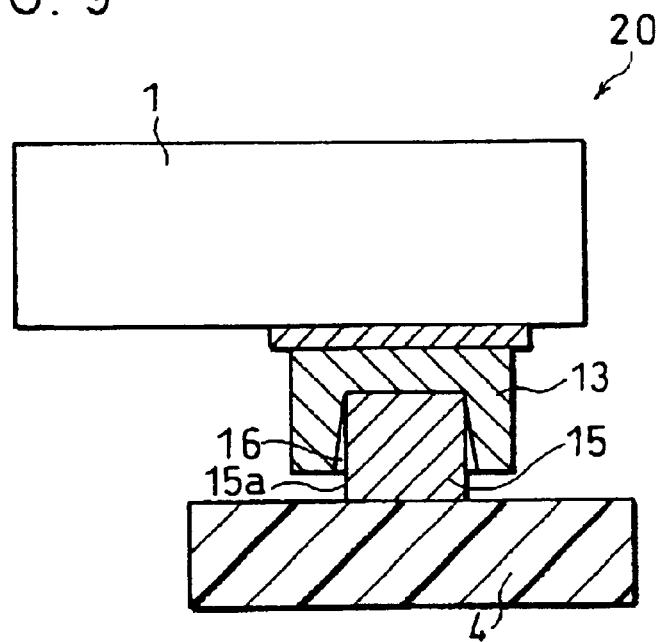
FIG. 9 is a cross-sectional view showing a semiconductor device in another state under experiment, when the experiment is conducted using the semiconductor device shown in FIGS. 3(a) and 3(b).

It was found in the above experiment that, when the connection pressure of 1.47 N/bump (150 gf/bump) or more is applied to the semiconductor device 20 in which the diameter of the gold bump 13 is 80 μm and the width of the printed substrate pad 15 is 20 μm, a wedge-shaped crack 16, as shown in FIG. 9, for example, occurs between the gold bump 13 and the printed substrate pad 15 in the dented part of the gold bump 13.

The crack 16 is likely to vary according to the sizes of the printed substrate pad 15 and the gold bump 13, and it has been found that the crack 16 occurs under a pressure of a certain value or more.

Although it has not been confirmed whether the existence of the crack 16 will cause a problem on reliability, it is practically no problem at present.

Experiment Example 2 (Experiment on a Conventional Device)

Figure 10A:
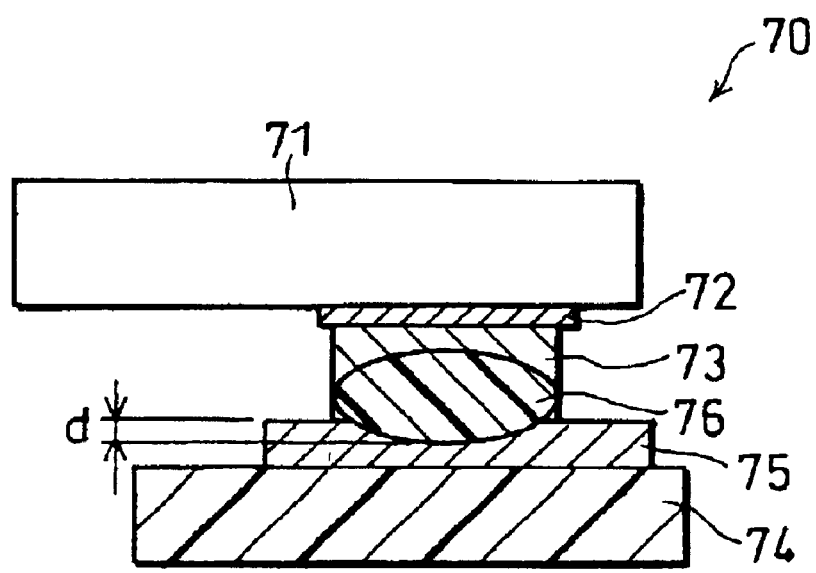
FIGS. 10(a) and 10(b) show a conventional semiconductor device.
Figure 10B:
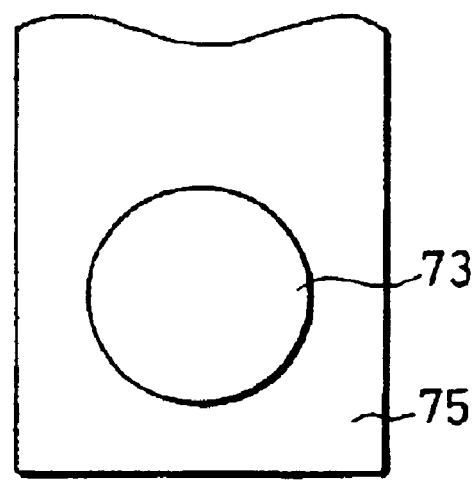

As shown in FIGS. 10(a) and 10(b), which are explanatory views of the foregoing conventional device, in the conventional semiconductor device 70 in which the area of the printed substrate pad 75 is larger than that of the gold bump 73 formed on the semiconductor chip 71, a dent depth formed when the gold bump 73 sank into the printed substrate pad 75 was measured when connection pressures of 0.98 N/bump (100 gh/bump), 1.47 N/bump (150 gh/bump), and 2.94 N/bump (300 gh/bump) were applied respectively from an upper surface of the semiconductor chip 71, also referred to as the bare chip 71, in a condition that the temperature was increased to a constant temperature.

In the experiment, after each connection pressure was applied to the upper surface of the semiconductor chip 71, the gold bump 73 was removed from the printed substrate pad 75, and the dent depth d formed on the printed substrate pad 75 was measured, in the same way as in the foregoing experiment example 1.

As a consequence, the result shown in Table 2 was obtained. When the gold bump 73 was removed from the printed substrate pad 75, the printed wiring pad 75 was dented so that the impression of the gold bump 73 remained on the printed wiring pad 75.

TABLE 2

| CONNECTION PRESSURE | DENT DEPTH d FORMED ON PRINTED SUBSTRATE PAD |
|---|---|
| 0.98 N/bump (100 gf/bump) | 1 μm |
| 1.47 N/bump (150 gf/bump) | 1.5~2 μm |
| 2.94 N/bump (300 gf/bump) | 4~5 μm |

[Comparison]

As shown in the above Tables 1 and 2, it has been confirmed that a greater dent depth d can be obtained with less pressure when the area of the printed substrate pad 15 is smaller than that of the gold bump 13 formed on the semiconductor chip 1.

This result is likely to indicate that, as for the engagement of the gold bump 13 and the side face 15a of the printed substrate pad 15, the gold bump 13 engages the printed substrate pad 15 deeper under the same connection pressure, compared with the result in the conventional device, thus providing a more satisfactory connection.

As described, the semiconductor device of the present invention is arranged such that a semiconductor chip having electrodes is flip chip mounted on a metal pattern formed on a substrate, by a bump, and the semiconductor chip and the substrate are fixed with a resin;

the metal pattern has a stepped section formed within an area joined to a corresponding bump; and the bump also joins a side face of the stepped section of the metal pattern.

Meanwhile, in a conventional semiconductor device, since a bump is joined to a flat metal pattern just by pressure, there is a possibility that, when heat is applied to the conventional semiconductor device in a process after the flip chip mounting, a resin gets softened and the connection surface between the bump and the metal pattern might deviate from the original position, thus the electrical connection between the bump and the metal pattern might become unsatisfactory.

However, in the semiconductor device of the present invention, the stepped section is formed on the metal pattern within the area joined to each bump, and each bump has a junction section also on a side face of the stepped section of the metal pattern.

Therefore, even if the resin gets softened when heat is applied in a process after the flip chip mounting, and a horizontal force is exerted between the bump and the metal pattern, the bump is restrained from moving in a horizontal direction by the side face of the stepped section of the metal pattern.

As a result, even when cooled down after the heat application, the bump and the metal pattern maintain the original junction condition at the original position without being deformed.

Therefore, the present invention offers the effect of providing a semiconductor device having a secure electrical connection between the bump and the metal pattern.

The semiconductor device of the present invention is arranged such that a semiconductor chip having electrodes is flip chip mounted on a metal pattern on a substrate by each bump, and the semiconductor chip and the substrate are fixed with a resin, and that when the substrate is seen from a side of the semiconductor chip, a contact area between the bump and the metal pattern is smaller than an area of the bump in a direction of the substrate.

The foregoing semiconductor device of the present invention can also be defined as a flip chip mounted semiconductor device including: a semiconductor chip having a bump; and a substrate having a wiring pattern (metal pattern or the like) joined to the bump, wherein a projected area resulting from an orthogonal projection of a contact area between the wiring pattern and the bump to the substrate is smaller than a projected area resulting from the orthogonal projection of the bump to the substrate, the orthogonal projection being performed in a direction of the substrate from a side of the semiconductor chip.

The foregoing semiconductor device of the present invention may be further defined as a flip chip mounted semiconductor device including: a semiconductor chip having a bump; and a substrate having a wiring pattern joined to the bump, wherein a contact area of the wiring pattern where the wiring pattern contacts the bump is smaller than an area of the bump on a side of the substrate.

That is, in a conventional semiconductor device, the metal pattern is formed larger than the bump.

However, in the present invention, when the substrate is seen from the side of the semiconductor chip, the contact area between the bump and the metal pattern is smaller than the entire contact area of the bump in a direction of the substrate. That is, the metal pattern is formed smaller than the bump, contrary to the conventional device.

Therefore, the bump is joined to both the metal pattern and the substrate as if it covers the metal pattern. In the foregoing structure, the bump also joins a side face of the metal pattern.

As a result, even if the resin gets softened when heat is applied in a process after the flip chip mounting, and a horizontal force is exerted between the bump and the metal pattern, the bump is restrained from moving in a horizontal direction by the side face of the metal pattern.

Therefore, even when cooled down after the heat application, the bump and the metal pattern maintain the original junction condition at the original position without being deformed.

In addition, since the bump is generally made of a material softer than that of the metal pattern, the structure that metal pattern is smaller than the bump, as in the present invention, enables the bump to bite on the metal pattern more firmly with the pressure in the same level as in a conventional device, providing more satisfactory electrical connection.

Therefore, the present invention offers the effect of providing a semiconductor device having a secure electrical connection between the bump and the metal pattern.

The semiconductor device of the present invention is arranged such that, in the above-mentioned semiconductor device, the tip of the metal pattern joined to the bump is formed in a semicircular shape with a hole in its center.

With this structure, the tip of the metal pattern can fit the circular-formed bump. Besides, the junction section of the bump can be formed on a side face of the metal pattern.

Therefore, the present invention offers an effect of providing a semiconductor device having a secure electrical connection between the bump and the metal pattern.

The semiconductor device of the present invention is arranged such that, in the above-mentioned semiconductor device, the metal pattern which contacts each bump is formed in a rectangular shape crossing the surface in contact with the bump.

With this structure, the metal pattern crossing the circular-formed bump can be covered with the bump. Besides, the junction section of the bump can be formed on a side face of the metal pattern.

Therefore, the present invention offers an effect of providing a semiconductor device having a secure electrical connection between the bump and the metal pattern.

The semiconductor device of the present invention is arranged such that, in the above-mentioned semiconductor device, the metal pattern which contacts each bump is formed in a polygon shape within the area joined to the bump.

With this structure, the metal pattern can be covered with the bump, within the area of the circular-formed bump. Besides, the junction section of the bump can be formed on a side face of the metal pattern.

Therefore, the present invention offers an effect of providing a semiconductor device having a secure electrical connection between the bump and the metal pattern.

The semiconductor device of the present invention is arranged such that, in the above-mentioned semiconductor device, a metal pattern contacting each bump is made up of a land for a through hole of a substrate.

Therefore, since the technology of and the material for the through hole, which is widely used in the substrate, can be used unchanged, cost reduction is achieved, and the present invention offers an effect of providing a semiconductor device having a secure electrical connection between the through hole and the bump utilizing a stepped section of the through hole.

The semiconductor device of the present invention is arranged such that, in the above-mentioned semiconductor device, a metal pattern contacting each bump is made up of a land for a via hole of a substrate 4.

Therefore, since the technology of and the material for the via hole, which is widely used in the substrate, can be used unchanged, cost reduction is achieved, and the present invention offers an effect of providing a semiconductor device having a secure electrical connection between the via hole and the bump utilizing a stepped section of the via hole.

A method for manufacturing a semiconductor device of the present invention includes the steps of:

conducting flip chip mounting by pressing a semiconductor chip having a bump on each electrode, onto metal patterns formed on a substrate; and fixing the semiconductor chip and the substrate with a resin, the method for manufacturing a semiconductor device further includes the steps of:

forming a stepped section on the metal pattern within an area joined to each bump; and joining the bump also to a side face of the stepped section of the metal pattern.

Therefore, even if the resin gets softened when heat is applied in a process after the flip chip mounting, and a horizontal force is exerted between the bump and the metal pattern, the bump is restrained from moving in a horizontal direction by the side face of the stepped section of the metal pattern.

As a result, even when cooled down after the heat application, the bump and the metal pattern maintain the original junction condition at the original position without being deformed.

Therefore, the present invention offers an effect of providing a method for manufacturing a semiconductor device having a secure electrical connection between the bump and the metal pattern.

The method for manufacturing the semiconductor device of the present invention is arranged such that, in the above-mentioned method for manufacturing the semiconductor device, a resin in the form of an anisotropic conductive film is used to fix the semiconductor chip and the substrate, and when fixing, the semiconductor chip having the bump on each electrode is pressed onto the substrate with heat applied, via the foregoing resin in the form of an anisotropic conductive film.

Thus, when fixing a semiconductor chip and a substrate with the foregoing resin in the form of an anisotropic conductive film, the foregoing resin in the form of an anisotropic conductive film is less influenced by thermal expansion than a general resin.

Therefore, in the case that the resin gets softened when heat is applied in a process after the flip chip mounting, and a horizontal force is exerted between the bump and the metal pattern, the horizontal force exerted between the bump and the metal pattern can be suppressed.

As a result, even when cooled down after the heat application, the bump and the metal pattern securely maintain the original junction condition at the original position without being deformed.

Therefore, the present invention offers an effect of providing a method for manufacturing a semiconductor device having a secure electrical connection between the bump and the metal pattern.

The method for manufacturing the semiconductor device of the present invention is arranged such that, in the above-mentioned method for manufacturing the semiconductor device, each bump on the semiconductor chip and the metal pattern on the substrate are joined using ultrasonic vibrations, and a spacing formed between the semiconductor chip and the substrate is sealed with a resin.

Since ultrasonic vibrations are used to join the bump and the metal pattern, the junction between the two elements is ensured.

Therefore, the present invention offers an effect of providing a method for manufacturing a semiconductor device having a secure electrical connection between the bump and the metal pattern.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A method for manufacturing a semiconductor device comprising conducting flip chip mounting by pressing a semiconductor chip including a bump onto a wiring pattern formed on a substrate, said method for manufacturing a semiconductor device further comprising:

i) forming the wiring pattern which includes a stepped section on the substrate; and ii) joining said bump to both the wiring pattern and the substrate so as to cover an outside of the wiring pattern, so as to join said bump to both (a) at least one side face of the stepped section of the wiring pattern and (b) a portion of the substrate outside of the outer periphery of the wiring pattern to which the bump is joined.

2. The method for manufacturing a semiconductor device of claim 1, further comprising the step of: iii) fixing said semiconductor chip and said substrate with a resin.

3. The method for manufacturing the semiconductor device of claim 2, wherein:

in said step iii), an anisotropic conductive film is used as said resin; and said step iii) includes the step of depressing said semiconductor chip onto the substrate with heat applied, via said anisotropic conductive film.

4. The method for manufacturing the semiconductor device of claim 2, wherein:

said step ii) includes the step of joining said bump of said semiconductor chip and said wiring pattern formed on said substrate using ultrasonic vibrations; and said step iii) is carried out after said step ii), whereby a spacing formed between said semiconductor chip and said substrate is sealed with said resin.

5. The method for manufacturing the semiconductor device of claim 1, wherein said step ii) includes the steps of:

forming said bump on said semiconductor chip using a softer material than that of said wiring pattern; and depressing said bump of said semiconductor chip Onto a portion having a stepped section of said wiring pattern.

6. The method of claim 1, wherein said wiring pattern patterned on the substrate by said step i) has a flat upper surface and a stepped section formed by a hole.

7. The method of claim 1, wherein said flip chip mounting of the semiconductor chip onto the pattern utilizes a pressure of from 10 to 150 grams per bump.

8. The method of claim 1, wherein said side face of the stepped section of the wiring pattern is oriented perpendicular to a mounting surface of the substrate.

9. The method of claim 8, wherein said at least one side face of the stepped section of the wiring pattern includes at least a first side face and a second side face to be jointed to the substrate.

10. A method for manufacturing a semiconductor device, the method comprising:

conducting flip chip mounting by pressing a semiconductor chip including a bump on an electrode, onto a metal pattern formed on a substrate; and fixing said semiconductor chip and said substrate with a resin, the method for manufacturing a semiconductor device further comprising:

joining said bump to both the metal pattern and the substrate so as to cover an outside periphery of the wiring pattern, so as to form a stepped section of the metal pattern joined to the bump, and so as to join said bump also to at least one outside face of the stepped section of the wiring pattern.

11. The method for manufacturing a semiconductor device of claim 10, wherein:
   a resin in the form of an anisotropic conductive film is used as said resin for fixing said semiconductor chip and said substrate; and
   said semiconductor chip having said bump on each electrode is pressed onto said substrate with heat applied, via said resin in the form of an anisotropic conductive film.

12. The method for manufacturing the semiconductor device of claim 10, comprising the steps of:
   i) joining said bump on said semiconductor chip and said metal pattern formed on said substrate using ultrasonic vibrations; and
   ii) sealing a spacing formed between said semiconductor chip and said substrate with said resin after carrying out said step i).

13. The method of claim 10, wherein said metal pattern patterned on the substrate has a flat upper surface and a stepped section formed by a hole in a surface in contact with each bump.

14. The method of claim 10 wherein said flip chip mounting of the semiconductor chip onto the pattern utilizes a pressure of from 10 to 150 grams per bump.

15. The method of claim 10, wherein said side face of the stepped section of the metal pattern is oriented perpendicular to a mounting surface of the substrate.

16. The method of claim 15, wherein said at least one side face of the stepped section of the metal pattern includes at least a first side face and a second side face to be jointed to the substrate.

* * * * *